(12) United States Patent
Wagenleitner et al.

(10) Patent No.: US 11,488,851 B2
(45) Date of Patent: Nov. 1, 2022

(54) METHOD AND DEVICE FOR ALIGNMENT OF SUBSTRATES

(71) Applicant: EV Group E. Thallner GmbH, St. Florian am Inn (AT)

(72) Inventors: Thomas Wagenleitner, Aurolzmunster (AT); Dominik Zinner, Zell an der Pram (AT); Jurgen Markus Suss, Rainbach (AT); Christian Sinn, Andorf (AT); Jurgen Mallinger, Senftenbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 17/162,180

(22) Filed: Jan. 29, 2021

(65) Prior Publication Data

US 2021/0151339 A1 May 20, 2021

Related U.S. Application Data

(63) Continuation of application No. 16/830,389, filed on Mar. 26, 2020, now Pat. No. 10,943,807, which is a continuation of application No. 16/323,539, filed as application No. PCT/EP2016/070289 on Aug. 29, 2016, now Pat. No. 10,692,747.

(51) Int. Cl.
| | |
|---|---|
| *H01L 21/00* | (2006.01) |
| *H01L 21/68* | (2006.01) |
| *H01L 21/67* | (2006.01) |
| *H01L 23/544* | (2006.01) |
| *H01L 21/683* | (2006.01) |

(52) U.S. Cl.
CPC ...... *H01L 21/681* (2013.01); *H01L 21/67092* (2013.01); *H01L 21/67259* (2013.01); *H01L 23/544* (2013.01); *H01L 21/67121* (2013.01); *H01L 21/67144* (2013.01); *H01L 21/6838* (2013.01); *H01L 2223/5442* (2013.01); *H01L 2223/54426* (2013.01)

(58) Field of Classification Search
CPC ............. H01L 21/681; H01L 21/67144; H01L 21/67212; H01L 21/67259; H01L 23/544
See application file for complete search history.

(56) References Cited

U.S. PATENT DOCUMENTS

| | | |
|---|---|---|
| 6,214,692 B1 | 4/2001 | Thallner |
| 8,454,771 B2 | 6/2013 | Horikoshi |
| 9,194,700 B2 | 11/2015 | Kast et al. |
| | (Continued) | |

FOREIGN PATENT DOCUMENTS

| | | | |
|---|---|---|---|
| EP | 2 612 109 B1 | 7/2013 | |
| EP | 2 656 378 B1 | 10/2013 | |
| | (Continued) | | |

OTHER PUBLICATIONS

International Search Report from corresponding International Patent Application No. PCT/EP2016/070289 dated Mar. 21, 2017.

(Continued)

*Primary Examiner* — Nicholas J Tobergte
(74) *Attorney, Agent, or Firm* — Kusner & Jaffe

(57) ABSTRACT

A method for aligning and contacting a first substrate with a second substrate using a plurality of detection units and a corresponding device for alignment and contact.

21 Claims, 2 Drawing Sheets

(56) References Cited

U.S. PATENT DOCUMENTS

| | | |
|---|---|---|
| 9,299,620 B2 | 3/2016 | Horikoshi |
| 9,312,161 B2 | 4/2016 | Wimplinger et al. |
| 9,418,882 B2 | 8/2016 | Thallner |
| 9,576,825 B2 * | 2/2017 | Figura ............... H01L 21/67092 |
| 9,851,645 B2 * | 12/2017 | Wagenleitner .......... H01L 22/26 |
| 9,919,508 B2 * | 3/2018 | Okamoto .......... H01L 21/67092 |
| 10,388,545 B2 * | 8/2019 | Figura ............... H01L 21/67259 |
| 10,692,747 B2 * | 6/2020 | Wagenleitner ........ H01L 23/544 |
| 2007/0252994 A1 | 11/2007 | Bijnen et al. |
| 2010/0139836 A1 | 6/2010 | Horikoshi |
| 2013/0244350 A1 | 9/2013 | Horikoshi |
| 2015/0210057 A1 | 7/2015 | Wagenleithner et al. |
| 2015/0228521 A1 | 8/2015 | Wimplinger et al. |
| 2016/0148826 A1 * | 5/2016 | Thallner ................ B65G 47/26 414/781 |
| 2016/0240420 A1 | 8/2016 | Wagenleitner |

FOREIGN PATENT DOCUMENTS

| | | |
|---|---|---|
| JP | 2005-251972 A | 9/2005 |
| JP | 2007-208031 A | 8/2007 |
| JP | 2010-135836 A | 6/2010 |
| JP | 2011-216788 A | 10/2011 |
| JP | 2014-013916 A | 1/2014 |
| JP | 2015-056495 A | 3/2015 |
| JP | 2016-503589 A | 2/2016 |
| KR | 10-2010-0063000 A | 6/2010 |
| WO | WO 2009/022457 A1 | 2/2009 |
| WO | WO-2009/022457 A1 | 2/2009 |
| WO | WO-2010/023935 A1 | 3/2010 |
| WO | WO-2014/191033 A1 | 12/2014 |
| WO | WO-2014/202106 A1 | 12/2014 |
| WO | WO-2016/114329 A1 | 7/2016 |

OTHER PUBLICATIONS

Preliminary Examination Report from corresponding International Patent Application No. PCT/EP2016/070289 dated Aug. 21, 2018.
Hansen, Friedrich: Justierung, VEB Verlag Technik, 1964, para. 6.2.4, Umschlagmethode, with English language machine translation.
Office Action issued in corresponding U.S. Appl. No. 16/830,389 dated Sep. 2, 2020.

* cited by examiner

METHOD AND DEVICE FOR ALIGNMENT OF SUBSTRATES

RELATED APPLICATIONS

The present application is a continuation of U.S. application Ser. No. 16/830,389, filed Mar. 26, 2020, which is a continuation of U.S. application Ser. No. 16/323,539, filed Feb. 6, 2019 now U.S. Pat. No. 10,692,747, issued on Jun. 23, 2020), which is a U.S. National Stage Application of International Application No. PCT/EP2016/070289, filed Aug. 29, 2016, said patent applications hereby fully incorporated herein by reference.

FIELD OF THE INVENTION

The invention relates to a method for aligning and contacting a first substrate with a second substrate and a corresponding device.

BACKGROUND OF THE INVENTION

In the semiconductor industry, alignment equipment (aligners) is used to align substrates, in particular wafers, with one another, in order to join them together in a further process step. The joining process is called bonding.

Alignment processes in which alignment markings are present on the substrate surfaces to be bonded are referred to as face-to-face alignments.

Inasmuch as the substrates are not transparent for the electromagnetic radiation that is used to measure the substrates in order to enable a detection and/or determination of the position and orientation of the alignment markings from the external substrates surfaces facing away from the substrates surfaces to be bonded, alignment markings are detected with image detection means between the substrates before the substrates are brought towards one another.

This had various drawbacks, in particular particle contamination by the camera and a large distance between the substrates to allow the positioning of the camera between two substrates for the detection. Alignment errors during the mutual approach arise from this.

An improvement of the face-to-face alignment is represented by the alignment equipment of publication U.S. Pat. No. 6,214,692B1, which can be regarded as the closest prior art. In the case of the latter, two groups of lenses are used with in each case two lenses lying opposite each other, in order to create a system with two reference points in relation to which the substrates are mutually positioned. The reference points are points of intersection of the optical axes of two lenses lying opposite one another.

The problem with the prior art includes the fact that the increasing demands made on alignment accuracy can no longer be met by the disclosed open, controlled methods.

Publication U.S. Pat. No. 6,214,692B1 is based on the comparison and the position correction of two images of alignment markings. The position of alignment markings on the two substrates arranged face-to-face is detected individually by means of a camera system. A positioning table (substrate holder and stage) is actuated from a calculated relative orientation and relative position of the alignment markings in such a way that the incorrect position is corrected. The positioning table comprises guide transducers and incremental path transducers positioned close to the drive.

SUMMARY OF THE INVENTION

It is an object of the present invention to provide a device and a method for the alignment and contacting of substrates, with which a more precise and more efficient alignment and contacting of the substrates is enabled.

This problem is solved with the features of the independent claim(s). Advantageous developments of the invention are given in the sub-claims. All combinations of at least two features given in the description, the claims and/or the figures also fall within the scope of the invention. In stated value ranges, values lying inside the stated limits are also deemed to be disclosed as limiting values and can be claimed in any combination.

The invention is based on the idea of also carrying out a detection of an additional (in particular third) alignment marking prior to an alignment, said additional marking being provided either on one of the substrates to be aligned or on the substrate holder. In particular, the additional alignment marking is not arranged on the contact faces of the substrates. The additional alignment marking is preferably arranged on a side of the substrate or the substrate holder facing away from the contact face or arranged parallel with the contact face.

The alignment of the substrates with one another takes place in particular indirectly on the basis of alignment markings which are located on contact faces of the substrates. The alignment markings on mutually opposite sides of the substrates lying opposite one another are in particular complementary to one another. Alignment markings can be any objects that can be aligned with one another, such as crosses, circles or squares or propeller-like shapes or grid structures, and in particular phase grids for the spatial frequency domain.

The alignment markings are preferably detected by means of electromagnetic radiation of specific wavelength and/or wavelength ranges. At present, the latter include infrared radiation, visible light or ultraviolet radiation. The use of radiation of shorter wavelength such as EUV or x-rays is however also possible.

An—in particular independent—aspect of the present invention is that the alignment takes place, in particular exclusively, by means of the detection of the additional alignment marking. Exclusively is understood to mean that the other (in particular the first and second) alignment markings are not or cannot be detected during the alignment.

According to an advantageous embodiment of the invention, the first substrate and the second substrate are arranged between the first substrate holder and the second substrate holder with a spacing A between the first contact face and the second contact face in a Z-direction. Spacing A amounts in particular to less than 500 microns, particularly preferably less than 100 microns, in the optimum case less than 50 microns, in the ideal case less than 10 microns.

The method according to the invention is in particular a method for the face-to-face alignment of at least two substrates with an arbitrary electromagnetic radiation, in particular with UV light, more preferably with infrared light, most preferably with visible light and/or sequential enabling of optical paths for the observation of the first and second alignment markings, wherein a supplementation with at least one additional optical path for the precise reproduction of the substrate and substrate holder position is provided, which additional optical path is not arranged or does not run between the substrates during the alignment of the substrates, but rather enables a detection from outside.

The method according to the invention increases the alignment accuracy in particular by means of additional X-Y position and/or orientation information, which is detected with additionally provided detection units and/or measurement and control systems and used for controlling the alignment.

For this purpose, the device according to the invention comprises an in particular software-assisted control unit, by means of which the steps and components described here are controlled. According to the invention, closed control circuits and controls are understood to be included in the control unit.

X- and Y-direction or X- and Y-position are understood to mean directions or positions arranged in an X-Y coordinate system or respectively in an arbitrary Z-plane of the X-Y coordinate system. The Z-direction is arranged orthogonal to the X-Y direction.

The X- and Y-direction corresponds in particular to a lateral direction.

Position features are derived/calculated from the position and/or orientation values of the alignment markings of the substrates and from alignment markings on the substrate holder.

According to the invention, at least one additional position feature is in particular detected with at least one additional measurement system with a new, additional optical path. The at least one additional alignment marking is preferably located in the spatial proximity of the alignment markings of the substrates.

The method according to the invention and the device according to the invention thus comprise in particular at least one additional measurement and/or control system, wherein the alignment accuracy is increased by additional measured values and correlations with at least one of the measured values of the other detection units. By means of a correlation of at least one of the measured alignment markings in the bond interface between the contact faces with an the alignment marking also visible when the substrates are aligned, the direct observability of an alignment mark and therefore a real-time measurement and control during the alignment is enabled. The alignment accuracy of the substrates thus increases.

The additional alignment marking is in particular arranged on the rear side of the substrate holder.

An unequivocal correlation is in particular produced between the additionally added position feature on the substrate holder and the position features on the substrates, said correlation preferably not being changed up to and during the alignment.

As a result of the additionally added position features on the substrate holder, which are correlated unequivocally with the position features on the substrate, a direct observation of the position features on the substrate can be replaced by a direct observation of the position features on the substrate holder. This has the advantage that the observable part of the substrate holder can virtually always be arranged in the field of view or measurement range of the additional measurement system.

An active feedback of the data for the positioning and position correction increases the accuracy compared to a controlled positioning in the prior art, since a control option of the actual status of the position is provided in closed control circuits. In particular, a predefined distance with a given number of increments is not therefore travelled, but rather the distance already travelled is measured, so that a comparison between setpoint and actual can be made, in particular with regard to speeds and/or accelerations. The aim of the invention is to increase the accuracy of the alignment of two substrates using a method with which the alignment can be observed in real-time, in particular from outside the bond interface. The substrates are arranged in particular with a minimum spacing from one another and no item of equipment is preferably located between the substrates.

The core idea of the invention is in particular the introduction of at least one additional measurement and control system and the linking of the existing measured values with the additional, newly detected position and/or orientation values. As a result of the correlation of the measured alignment markings in the bond interface with an alignment marking on the substrate holder, in particular on its rear side, and/or the substrate, in particular at its rear side, which can be detected, preferably directly, during the alignment, the direct observability of the additional alignment marking and a real-time measurement and control is enabled. The alignment accuracy is improved by this measure.

During the detection of the first alignment marking, the second substrate and the second substrate holder are moved in an X-Y direction out of the optical axis of the first detection unit, in order to enable a detection.

During the detection of the second alignment marking, the first substrate and the first substrate holder are moved in an X-Y direction out of the optical axis of the second detection unit, in order to enable a detection.

Device

The device according to the invention for the alignment of at least two substrates comprises at least one optical system, comprising two lenses or detection units, in particular aligned with one another, the optical paths of which preferably meet in a common focal point.

According to an advantageous embodiment, the optical system comprises beam-forming and/or deflection elements such as mirrors, lenses, prisms, radiation sources in particular for Köhler illumination and image detection means such as cameras (CMOS sensors, or CCD, or area or line or point detection means such as a phototransistor) and movement means for focusing and evaluation means for controlling the optical system.

In an embodiment of the device according to the invention, an optical system and a rotation system are used for the substrate positioning according to the principle of the turnover adjustment, see in this regard Hansen, Friedrich: Justierung, VEB Verlag Technik, 1964, para. 6.2.4, Umschlagmethode, wherein at least one measurement is carried out in a defined position and at least one measurement is carried out in a turned-over, oppositely orientated position rotated through 180 degrees. The measurement result thus obtained is in particular free from eccentricity errors.

A development of the device according to the invention comprises two, in particular identical, structurally identical optical systems with lenses aligned with one another and fixable relative to one another.

An inventive development of the device comprises more than two identical optical systems with aligned lenses.

Furthermore, a device according to the invention comprises substrate holders for holding the substrates to be aligned.

In a further embodiment of the device according to the invention, at least one substrate holder is used which is at least partially, preferably over 95%, transparent at defined points for the in particular simultaneous observation of the two substrate sides.

In a further embodiment of the device according to the invention, at least one substrate holder is used, which comprises openings and/or apertures and/or inspection windows at defined points for the in particular simultaneous observation of the two substrates sides.

Furthermore, the device according to the invention can comprise a system for producing pre-bonds.

Furthermore, a device according to the invention preferably comprises movement devices with drive systems, guide systems, holding fixtures and measurement systems, in order to move, to position and to align with one another the optical systems and the substrate holders and/or substrates.

The movement devices can generate each movement as a result of individual movements, so that the movement devices can preferably comprise rapid rough-positioning devices not meeting the accuracy requirements as well as precisely operating fine-positioning devices.

A setpoint value for the position to be approached is an ideal value. The movement device moves near to the ideal value. Reaching a defined area around the ideal value can be understood to mean reaching the setpoint value.

A rough-positioning device is understood to mean a positioning device when the approach and/or repetition accuracy diverges from the setpoint value by more than 0.1%, preferably more than 0.05%, particularly preferably more than 0.01%, related to the total travel path or rotation range, in the case of rotating rotational drives related to a full revolution of 360 degrees.

With a rough-positioning device, for example, an approach accuracy of 600 mm*0.01% thus results with a travel path of over 600 mm, i.e. more than 60 microns as residual uncertainty. In other embodiments of rough-positioning, the residual uncertainty of the approach or repetition accuracy is less than 100 microns, preferably less than 50 microns, particularly preferably less than 10 microns. Thermal interference variables should preferably also be taken into account.

A rough-positioning device performs the positioning task with sufficient accuracy only if the difference between the actual position in fact reached and the setpoint value of the position lies within the travel range of an assigned fine-positioning device.

An alternative rough-positioning device performs the positioning task with sufficient accuracy in particular only if the difference between the actual position in fact reached and the setpoint value of the position lies within half the travel range of an assigned fine-positioning device.

A fine-positioning device is understood to be a positioning device when the residual uncertainty of the approach and/or repetition accuracy from the setpoint value does not exceed less than 500 ppb, preferably less than 100 ppb, in the ideal case 1 ppb related to the total travel path or rotation range.

The fine-positioning device according to the invention will preferably have an absolute positioning error less than 5 microns, preferably less than 1 micron, particularly preferably less than 100 nm, very particularly preferably less than 10 nm, in the optimum case less than 5 nm, in the ideal case less than 1 nm.

The present device and the associated processes comprise at least two positioning devices having extremely high precision and reproducibility. A concept of mutual error corrections can be used for the quality of the alignment of the substrates. Thus, with a known misalignment (warping and/or displacement) of a substrate and, corresponding thereto, of the positioning device, the alignment accuracy can be increased with the adjustment and correction of the position of the other positioning device and the other substrate with correction values or correction vectors. It is a question here of the magnitude and nature of the warping and/or displacement as to how the control or regulation uses rough and fine positioning or only rough positioning or only fine positioning for the error correction.

In the subsequent text, positioning devices (rough or fine or combined positioning devices) and alignment means are regarded and used as synonyms.

According to the invention, the alignment of the substrates with one another can take place in all six degrees of freedom of movement: three translations according to the coordinate directions x, y and z and three rotations about the coordinate directions. According to the invention, the movements can be carried out in any direction and orientation. The alignment of the substrates in particular comprises a passive or active wedge error compensation, preferably according to the disclosure in publication EP2612109B1.

Robots for substrate handling are included as movement devices. The holding fixtures can be integrated as components or integrated as functions in the movement devices.

Furthermore, a device according to the invention preferably comprises control systems and/or evaluation systems, in particular computers, in order to carry out the described steps, in particular movement sequences, to carry out corrections, to analyse and store operational statuses of the device according to the invention.

Processes are preferably created as formulas and executed in a machine-readable form. Formulas are optimized compilations of values of parameters, which are connected in a functional or process-related manner. The use of formulas makes it possible to ensure reproducibility of the production sequences.

Furthermore, a device according to the invention according to an advantageous embodiment comprises supply and/or auxiliary and/or supplementary systems (compressed air, vacuum, electrical energy, liquids such as hydraulics, coolants, heating agents, means and/or devices for temperature stabilisation, electromagnetic shielding).

Furthermore, the device according to the invention comprises frames, claddings, vibration-suppressing or -damping or -absorbing active or passive subsystems.

Measurement

Furthermore, a device according to the invention comprises at least one measurement system, preferably with measurement units for each movement axis, which can be constituted in particular as displacement measuring systems and/or angle measuring systems.

Both tactile, i.e. touch, or non-tactile measurement methods can be used. The standard measure, the unit of the measurement, can be present as a physical-material object, in particular as a scale, or can be implicitly present in the measurement process, such as the wavelength of the radiation used.

At least one measurement system can be selected and used for the achievement of the alignment accuracy. Measurement systems implement measurement methods. In particular, use can be made up of inductive methods and/or capacitive methods and/or resistive methods and/or comparison methods, in particular optical image recognition methods and/or incremental or absolute methods (with in particular glass standard measures as a scale, or interferometers, in particular laser interferometers, or with a magnetic standard measure) and/or travel-time measurements (Doppler method, time-of-flight method) or other time recording methods and/or triangulation methods, in particular laser triangulation, autofocusing methods and/or intensity measurement methods such as fibre-optic telemeters.

Additional Measurement System with Variations, Substrate Holder

Furthermore, a particularly preferred embodiment of the device according to the invention comprises at least one additional measurement system, which detects the X-Y position and/or alignment orientation and/or angular position of at least one of the substrates and/or one of the substrate holders in relation to a defined reference, in particular to the frame. A part made in particular of natural hard stone or mineral cast iron or spheroidal graphite cast iron or hydraulically bound concrete can be provided as a frame, said part being in particular vibration-damped and/or vibration-insulated and/or provided with vibration absorption.

According to the invention, measured values can be combined with one another and/or referenced to and/or correlated with one another, so that, from a measurement of one alignment marking, conclusions can be drawn as to the position of the other alignment marking related thereto.

In an embodiment according to the invention, the position of a substrate holder is detected at a point (or position or measurement spot or field of view) in relation to the reference, in particular the first alignment marking on a first substrate and/or the second alignment marking on the second substrate.

In a further embodiment according to the invention, the position of a substrate holder is detected at precisely two points in relation to the reference.

In a further embodiment according to the invention, the position of a substrate holder is detected at precisely three points in relation to the reference and the position and orientation of the substrate holder are thus determined.

In a first embodiment according to the invention, optical pattern recognition by means of camera systems and patterns applied on the substrate holder can be used for a position determination at a point or at two points or three points or an arbitrary number of points. The patterns are detected in a real-time system, in particular continuously during the alignment. The listed measurement methods can also be used for the position determination.

A reversal is conceivable according to the invention, in particular by the provision of the detection units on the substrate holder and the provision of alignment markings on the frame.

In order that a detection, evaluation and control can take place at an arbitrary time, in particular continuously, the patterns are distributed according to an advantageous embodiment over a larger area than the field of view of an image detection system of the detection units, in order to provide the control unit (and/or regulating unit) with measured values, in particular continuously.

In a further inventive embodiment of the device, at least one of the substrate holders comprises a through-opening for the detection of the alignment markings from the support side of the substrates.

According to the invention, it is advantageous if at least one of the substrates comprises at least one alignment marking on the surface to be bonded (contact face) and at least one alignment marking on the opposite-lying surface (support face).

The alignment markings are preferably a plurality of alignment marks distributed, preferably uniformly, in particular unequivocally assignable, on the support face of at least one of the substrates. The alignment marking on the support face can be correlated at least in relation to its X-Y position and/or alignment orientation with the X-Y position and/or alignment orientation of the alignment marking of the same substrate. This enables a continuous position determination during the loading and alignment of the substrates up to the substrates making contact.

In a development of the present invention, the alignment marks on the support face are distributed, in particular uniformly, up to an edge zone (edge exclusion zone) of the substrate.

In a further embodiment of at least one of the substrates, the alignment marks on the support face are distributed one-to-one with respect to the contact face of the same substrate and the alignment marking arranged on the contact face.

In a further embodiment according to the invention, at least one interferometer with a suitably constituted, in particular monolithic, reflector for the detection of the X-Y position and/or the orientation determination of the substrate holder can be used for an X-Y position determination at at least one point. The number of interferometers is in particular equal to the number of reflection faces of the reflector.

The substrate holder, in particular formed from a monolithic block, preferably comprises at least two of the following functions:

substrate fixing by means of vacuum (vacuum tracks, connections), shape compensation for the deformation of the substrate by means of mechanical and/or hydraulic and/or piezoelectronic and/or pyroelectrical and/or electrothermal actuation elements, particularly preferably according to embodiments EP2656378B1, WO02014191033A1, position and/or orientation determination (standard measures, reflection faces and/or prisms, in particular reflectors for interferometry, register marks and/or register mark fields, two-dimensionally constituted standard measures for planes, volume standard measures, in particular steps)

movement (guide tracks)

Movement devices according to the invention that are not used for the fine adjustment are in particular constituted as robot systems, preferably with incremental displacement sensors. The accuracy of these movements devices for auxiliary movements is decoupled from the accuracy for the alignment of the substrate stack, so that the auxiliary movements are performed with lower repetition accuracy of less than 1 mm, preferably less than 500 microns, particularly preferably less than 150 microns.

The control and/or regulating of movement devices according to the invention for the (lateral) alignment (fine adjustment) is in particular carried out on the basis of X-Y positions and/or alignment orientations detected with other measurement means. The accuracy of these movements devices is preferably less than 200 nm, preferably less than 100 nm, particularly preferably less than 50 nm, very particularly preferably less than 20 nm, in the optimum case less than 10 nm, in the ideal case less than 1 nm.

Method

A first embodiment of an alignment method according to the invention comprises the following, in particular at least partially sequential and/or simultaneous steps, in particular the following sequence:

First process step: The first/lower substrate is loaded with a support face on the first/lower substrate holder, wherein a first alignment marking is provided (present) on the opposite side (contact face).

Second process step: The first/lower substrate moves with the substrate holder into the field of view of a detection position of a first/upper detection device, in particular using movement devices for the rough adjustment.

Third process step: The optical system travels to the detection position, if this has not already been done by the second process step. Optionally, a self-calibration of the optical system can already take place at this time or before the initiation of the movement of the detection position.

Fourth process step: The first/upper detection device is focused onto the pattern of the first alignment marking to be detected, said pattern being arranged on the contact face of the substrate to be bonded.

Optionally, the optical system can adjust the second/lower detection unit onto the focus plane of the first/upper detection unit.

Fifth process step: Detection of the first alignment marking, in particular by means of pattern recognition. At the same time, in particular by synchronisation with the first detection unit, the X-Y position and/or alignment orientation of the first substrate holder and/or the first substrate is detected, preferably at a face other than the contact face, by an additional measuring system according to the invention (with a third detection unit).

Sixth process step: Clamping, in particular mechanically and/or electronically and/or magnetically, of the position of the optical system, in particular by reducing all the degrees of freedom to zero.

Seventh process step: The optical system adjusts the second/lower detection unit onto the focal plane of the first/upper detection unit.

Optionally, the adjustment has been carried out following the fourth process step and is not required.

Eighth process step: A control and evaluation computer (in particular in the control unit) performs abstractions and/or calculations in order to obtain measurement results for controlling the alignment: The control and evaluation computer in particular creates a correlation of the measurement results of the optical system and of the additional (third) measurement system and stores the results, in particular as a setpoint value of the X-Y position and/or an alignment orientation of the first/lower substrate holder and of the first/lower substrate.

Ninth process step: The first/lower substrate holder is moved out of the field of view (beam path for the detection) of the optical system. Blocking of the optical path for the first detection unit is thus removed. The optical system preferably continues to remain fixed.

Tenth process step: The second/upper substrate is loaded onto the second/upper substrate holder. This process step can already be carried out before one of the preceding process steps.

Eleventh process step: The second/upper substrate holder moves with the second/upper substrate into the field of view of the optical system.

Twelfth process step: The second/lower detection unit of the optical system seeks and detects, analogous to the first/upper detection unit, the alignment marking on the second/upper substrate. The optical system is not thereby moved mechanically, although a correction of the focusing is conceivable. Preferably, however, a focusing movement is not carried out either.

Thirteenth process step: The second/upper substrate and the second/upper substrate holder block the optical path of the first/upper detection unit, so that no direct observability/detection of the contact face of the first/lower substrate to be bonded is possible in the aligned position.

Fourteenth process step: The control and evaluation computer ascertains the alignment errors, regarding which reference is made to the disclosures in publications U.S. Pat. No. 6,214,692B1, WO2014202106A1. In particular, an alignment error vector is created from the alignment error. In particular, at least one correction vector is then calculated. The correction vector can be a vector parallel to the alignment error vector and opposite to it, so that the sum of the alignment error vector and the correction vector produces zero. In special cases, further parameters can be taken into account in the calculation of the correction vector, so that the result is different from zero.

Fifteenth process step: The X-Y position and the alignment orientation of the second/upper substrate (together with the substrate holder) are adjusted according to the correction vector and then clamped, so that the calculated alignment error is at least minimised, preferably eliminated.

Sixteenth process step: After the clamping/fixing of the second/upper substrate has taken place, the X-Y position of the second upper substrate is again detected/checked with the second/lower detection unit. Displacements and/or warping, which had been caused by the clamping, can thus be detected and minimised, in particular eliminated, by iteration of the twelfth to the fifteenth process step.

Alternatively, the detected displacements and/or warping can be taken into account to create correction values and/or correction vectors, so that an elimination can be taken into account in the subsequent process steps. The correction values for the displacements are preferably less than 5 microns, preferably less to the 1 micron, particularly preferably less than 100 nanometres, very particularly preferably less than 10 nanometres, in the optimum case less than 5 nanometres, in the ideal case less than 1 nanometer. The correction values for warping are in particular less than 50 micro-radians, preferably less than 10 micro-radians, particularly preferably less than 5 micro-radians, very particularly preferably less than 1 micro-radian, in the optimum case less than 0.1 micro-radians, in the ideal case less than 0.05 micro-radians.

In the fifteenth process step, analogous to the twelfth process step, at least one measurement of the position can take place before and at least one measurement after the fixing of the upper substrate. An iterative correction of the errors is conceivable according to the invention, so that the next process steps are only carried out after meeting a defined accuracy requirement (threshold value).

Sixteenth process step: The first/lower substrate holder moves back into the already detected position and orientation of the setpoint value (see eighth process step). The X-Y position and the alignment orientation of the lower substrate holder (together with substrate) are checked with the additional measurement system, in particular in real-time. The observability of the first alignment marking of the first substrate is not provided, since the clamped upper substrate holder blocks the optical path.

Seventeenth process step: The actual X-Y position and the alignment orientation of the first/lower substrate holder are corrected until such time as the difference from the setpoint value is zero, but at least a defined threshold value is not fallen below.

Eighteenth, optional process step: The substrates are joined, regarding which reference is made to the disclosure of publication WO2014191033A1.

Nineteenth process step: The substrate stack is unloaded from the device.

A second, alternative embodiment of the alignment method according to the invention comprises the following changes to the loading sequences for the upper and lower substrate as compared to the first embodiment:

As a first process step according to the invention, the first/lower substrate is loaded on the first/lower substrate holder.

As a second process step according to the invention, the second/upper substrate is loaded onto the second/upper substrate holder.

The process steps of the first embodiment then apply analogously.

In a third embodiment of the method according to the invention, the first and/or second method is changed in that the directions above and below are interchanged both in the device according to the invention and also in the method. In particular, the upper substrate holder is thus observed with at least one additional measurement system.

In a fourth embodiment of the method according to the invention, the listed processes are changed in that the loading sequence of the substrates is interchanged with the process result remaining the same.

In a fifth embodiment of the method according to the invention, speeding-up is achieved by parallelising the process steps, in particular the loading of the second substrate is already carried out during a pattern recognition step on the first substrate.

In a sixth embodiment of the method and associated device according to the invention, the additional measurement systems can detect the position and/or orientation both of the upper and also the lower substrate holder and/or the upper and also the lower substrate.

In a seventh embodiment of the method and associated device according to the invention, the additional measurement systems can detect the position and/or orientation of the upper substrate holder and/or the upper substrate.

All technically possible combinations and/or permutations and duplications of the functional and/or material parts of the device and the accompanying changes in at least one of the process steps or processes are deemed to be disclosed.

Insofar as device features are disclosed in the present text and/or in the subsequent description of the figures, these are also deemed to be disclosed as method features and vice versa.

Further advantages, features and details of the invention emerge from the following description of preferred examples of embodiment and on the basis of the drawings.

BRIEF DESCRIPTION OF THE DRAWINGS

Advantages and features of the invention are marked in the figures with reference numbers each identifying the latter according to embodiments of the invention, wherein components or features with an identical or identically acting function are marked with identical reference numbers.

DETAILED DESCRIPTION OF THE INVENTION

Figure 1:
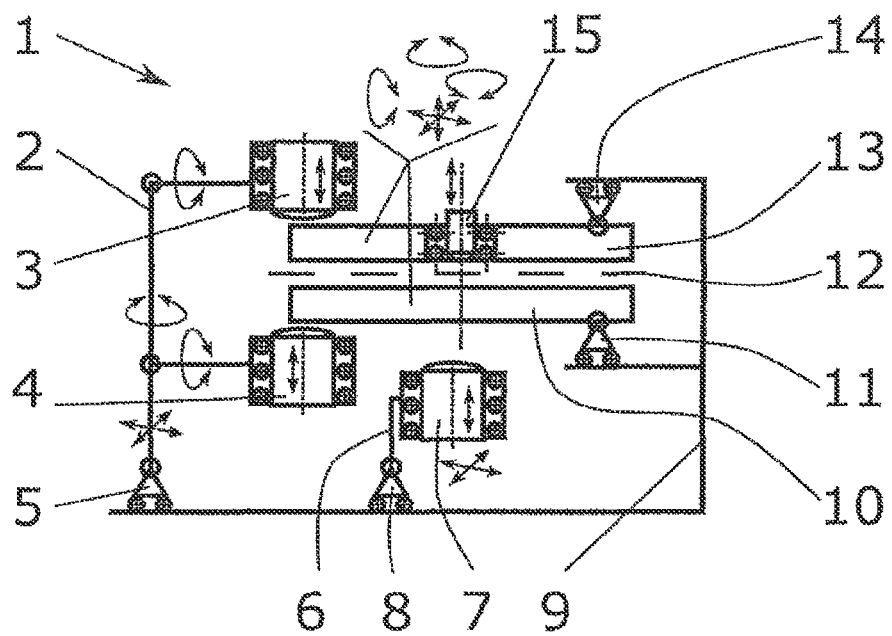
FIG. 1 shows a diagrammatic cross-sectional representation of a first embodiment of the device according to the invention.

FIG. 1 illustrates a diagrammatic functional representation (not true to scale) of the main components of a first embodiment of an alignment apparatus 1. Alignment apparatus 1 is capable of aligning substrates 16 (denoted as the first and/or lower substrate), 17 (denoted as the second and/or upper substrate) and/or substrate stacks with one another, said substrates not being shown in FIG. 1, and/or of joining the latter together at least partially and/or provisionally (so-called pre-bond). Possible movements/degrees of freedom of the functional components described below are represented symbolically by arrows.

First substrate 16 is loaded onto a first substrate holder 10 and can be fixed on the latter with no remaining degrees of freedom of substrate 16 relative to first substrate holder 10. Second substrate 17 is loaded onto a second substrate holder 13 and can be fixed on the latter with no remaining degrees of freedom of substrate 17 relative to second substrate holder 13.

First, in particular lower, substrate holder 10 is arranged on a first movement device 11 for holding and implementing feed and adjustment movements (alignment) of first substrate holder 10.

Second, in particular upper, substrate holder 13 is arranged on a second movement device 14 for holding and implementing feed and adjustment movements (alignment) of second substrate holder 13. Movement devices 11, 14 are in particular fixed to a common, solid table or frame 9, in order to reduce/minimise vibrations of all functional components.

For the observation (detection) of a first alignment marking 20 and a second alignment marking 21, there is an optical system 2 comprising:
  a first detection unit 3, in particular an image detection means, for detecting first alignment marking 20 on first substrate 16 and
  a second detection unit 4, in particular an image detection means, for detecting the second alignment marking on second substrate 17.

Optical system 2 can be focused onto a preferably common focal plane 12, which is located between first and second substrate 16, 17, when the latter are arranged for alignment. Movements of the optical system 2, in particular in the X-, Y- and Z-direction, are carried out by means of a positioning device 5 for positioning optical system 2. Positioning device 5 is in particular fixed to the solid table or frame.

In a particularly preferred embodiment, not represented, entire optical system 2 (with positioning means 5, detection units 3 and 4, etc.) is used in a twofold, mirror-symmetrical embodiment.

At least one additional, in particular optical, measurement system 6 with at least a third detection unit 7 of additional measurement system 6 is used for the inventive increase in the alignment accuracy by the detection of a third alignment marking 22. A movement of the additional measurement system is carried out with a positioning device 8.

Insofar as an optical measurement system 6 is involved, positioning device 8 can carry out focusing with regard to third alignment marking 22 by moving third detection unit 7 in the Z-direction. A positioning in the X-Y direction is also conceivable, wherein in particular fixing of measurement system 6, preferably to the table/frame, takes place during the alignment. Alternatively, the exact X-Y position of measurement system 8 must be known.

In the represented inventive embodiment of alignment apparatus 1, the X-Y position and/or orientation (in particular also the rotation orientation) of lower substrate holder 10 is in particular detected with particularly high accuracy by means of additional measurement system 6.

In a further inventive embodiment of alignment apparatus 1, not represented, the position and/or orientation of the upper substrate holder is in particular detected with particularly high accuracy by means of the additional measurement system.

In a further inventive embodiment of alignment apparatus 1, not represented, the positions and/or orientations of the upper substrate holder and the lower substrate holder are in particular detected with particularly high accuracy by means of the additional measurement system.

In a further inventive embodiment of the alignment apparatus, not represented, the position and/or orientation of at least one of the substrates is in particular detected with particularly high accuracy by means of at least one measurement system. For this purpose, the alignment markings on the contact face and the markings on the side facing away from the contact face are detected.

Figure 2A:
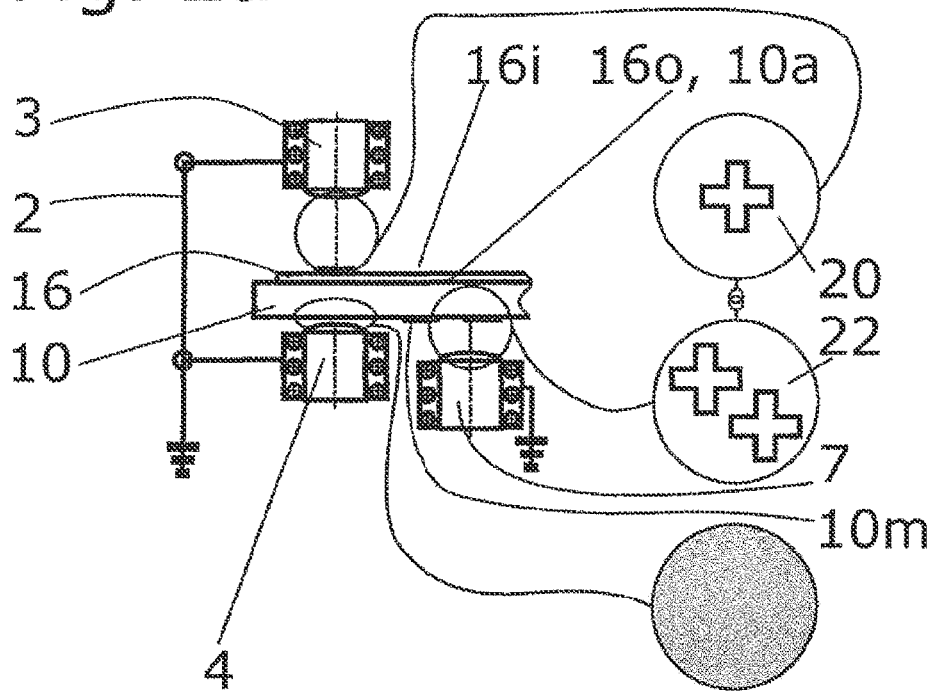
FIG. 2a shows a diagrammatic, enlarged cross-sectional representation of the embodiment according to FIG. 1a in a first process step.

FIG. 2a shows a diagrammatic representation of a process step according to the invention for assigning measured values of at least two detection units to one another, in particular two detection units for detecting at least two X-Y positions of alignment markings 20, 22 arranged on different sides of the first substrate 16 and/or first substrate holder 10.

First/lower substrate 16 is fixed on the first fixing face 10 of first substrate holder 10. As a fixing, use is made in particular of mechanical and/or electrostatic clamping, a pressing force, which is generated due to a pressure difference between the surroundings in normal atmosphere and the underpressure at first substrate holder 10, also referred to as a vacuum fixing. The fixing takes place in particular in such a way that first substrate 16 does not experience any parasitic or undesired movement relative to first substrate holder 10 throughout the entire method according to the invention; in particular, thermal expansion can be prevented or reduced, insofar as first substrate holder 10 and first substrate 16 each have a corresponding thermal expansion coefficient, preferably running in a linearly corresponding manner, wherein the difference in the thermal expansion coefficients and/or the linear course of the thermal expansion coefficients preferably amounts to less than 5%, preferably less than 3%, particularly preferably less than 1%.

The apparatus is preferably operated in a temperature-stabilised environment, in particular in a clean room, in which a temperature variation of less than 0.5 Kelvin, preferably less than 0.1 Kelvin, particularly preferably 0.05 Kelvin, in the optimum case less than 0.01 Kelvin can be complied with during an alignment cycle.

Fixed first substrate 16 and first substrate holder 10 can be understood to be a quasi-monolithic body for the performance of the movements of first substrate 16, which permit no relative movements with respect to one another.

This substrate fixing can take place in a form-fit and/or preferably in a friction-locked manner. The effect of a quasi-monolithic connection is that influences which could bring about a displacement and/or warping and/or deformation between the substrate holder and the substrate are at least reduced, preferably reduced at least by an order of magnitude, particularly preferably eliminated. The influences may be thermal, and/or mechanical, and/or flow-related and/or of a material nature (particles).

With a form-fit or friction-locked connection, the substrate can be connected to the substrate holder in such a way that the difference in a thermal expansion can in particular be prevented. Furthermore, the independent deformation of the substrate can be reduced, eliminated and/or corrected with the substrate holder, regarding which reference is made to the disclosure of EP2656378B1.

During the detection of first alignment marking 20, first substrate holder 10 is located in an optical path of first (upper) detection unit 3. First alignment marking 20 is arranged on contact face 16i of first substrate 16 to the bonded in the field of view, in particular in the optical path, of first (upper) detection unit 3. First detection unit 3 generates an in particular digital image, which is represented here diagrammatically as an alignment mark in the form of a cross. First alignment marking 20 can also comprise a plurality of alignment markings. A measured value is generated/calculated from the image of the alignment mark, said measured value characterising in particular the X-Y position and/or alignment orientation (in particular in the rotation direction about a Z-direction), i.e. the alignment state of first substrate 16.

During the detection of first alignment marking 20, second/lower detection unit 4 preferably delivers no measured value, especially since second substrate 17 is/has been arranged outside the optical path of first detection unit 3.

First/lower substrate holder 10 and/or first/lower substrate 16 comprise third alignment marking 22, with the aid of which the X-Y position and/or alignment orientation (in particular in the rotation direction about a Z-direction), i.e. the alignment state of substrate holder 10 and/or of first substrate 16, are detected in particular from another direction, preferably a direction lying diametrically opposite the first detection in the Z-direction.

A relative movement of first detection unit 3 towards the detection unit 7 can preferably be measured, more preferably no relative movement between first detection unit 3 and third detection unit 7 is carried out from the detection of first alignment marking 20 and third alignment marking 22 up to contacting of first and second substrate 16, 17.

Third (additional) detection unit 7 of additional measurement system 6 delivers a measured value of the X-Y position and/or orientation of first/lower substrate holder 10 from the measurement of the third alignment marking 22 of first/lower substrate holder 10. The measured value is in particular generated from a preferably digital image, which is represented symbolically as a cross. Third alignment marking 22 can also comprise a plurality of alignment markings.

The two measured values (X-Y position and/or alignment orientation of first alignment marking 20 of first substrate 16 and the X-Y position and/or alignment orientation of third alignment marking 22 of first substrate holder 10 or first substrate 16) are assigned to one another and/or correlated with one another, so that the X-Y position and/or alignment orientation of first alignment marking 20 can at all times be assigned one-to-one to the third alignment marking on the basis of the X-Y position and/or alignment orientation, in particular by detection of the X-Y position and/or alignment orientation.

By means of this process step, an alignment can be carried out without direct detection of the X-Y positions and/or alignment orientations of first alignment marking 20 and/or of second alignment marking 21 during the alignment and/or contacting of first substrate 16 with second substrate 17. Furthermore, the spacing between the substrates during the alignment can be minimised. The spacing can preferably already correspond to the spacing of the substrates during the detection of the first and second alignment markings.

In other words, an obstacle-free optical path between substrate holder 10 and additional measurement system 6 can in particular be provided, with which the alignment of the substrates can be or is undertaken in a control circuit. By means of this process step, the X-Y position and/or alignment orientation of first substrate holder 10 and therefore of the first substrate fixed on first substrate holder 10 can be precisely determined and re-established in a reproducible manner.

The re-establishment of the X-Y position and/or the alignment orientation in particular of substrate holder 10 and in particular the substrate monolithically connected thereto represents an, in particular, independent core aspect. The process steps for this have already been discussed elsewhere.

In particular, a repetition accuracy of the positioning (measured as a relative alignment error between the two substrates), also known as a reverse play, of less than 1 micron, preferably less than 100 nm, particularly preferably less than 30 nm, very particularly preferably less than 10 nm, in the optimum case less than 5 nm, in the ideal case less than 1 nm is achieved. The reverse play can also be the repeated approach of a given position with the aid of movement devices 11, 14 and/or 5, 8. The reverse play results from the movements of the movement devices, only the detection location varies, so that the measured magnitude exists as a relative alignment error. A positioning accuracy of a movement device that does not have any effect on the substrates can be regarded as a non-relevant reverse play.

According to the invention, it is preferable, for a further increase in the alignment accuracy, to operate first detection unit 3 in a time-synchronized manner with third detection unit 7, in particular with a time difference of the detections of the measured values of less than 1 tenth of a second, preferably less than 1 millisecond, particularly preferably less than 10 microseconds, very particularly preferably less than 1 microsecond, in the optimum case less than 1 ns, in the ideal case 0.0 ns. This is particularly advantageous, because the effect of interfering influences such as mechanical vibrations can be eliminated. Mechanical vibrations propagate, amongst other things with a structure-borne noise, at several thousand m/s in materials. If a control and the detection means operate more quickly than the propagation speed of the structure-borne noise, a disruption is reduced or eliminated.

If a disruption changes the orientation of first substrate 16 on first substrate holder 10 in such a way that first detection unit 3 has already recorded a measured value and additional measurement system 6 with detection unit 7 has not yet recorded a measurement value, the disruption can contribute towards a reduction in the accuracy of the alignment, because in the time between the measured values being recorded by detection means 3 and 7, vibration-induced, rapid mechanical position changes in order of magnitude of the nanometre or micron can in particular take place. If the recording of the measured values takes place with a time lag (of the order of seconds or minutes), further interfering influences such as heat-related changes in shape and changes in length can also reduce the alignment accuracy.

If first detection unit 3 and third detection unit 7 are synchronised with one another (in particular by simultaneous triggering of the detection and equalising the detection time and/or identical integration time for camera systems), several interfering influences can be reduced, in the optimum case eliminated, since the detection is to take place at a time when the interfering influences have the least possible effect on the detection accuracy.

In a possible embodiment of the apparatus, the detection can take place with known, in particular periodic interfering influences, in particular synchronised at the peak of the oscillation. For this purpose, vibration sensors (acceleration sensors, interferometers, vibrometers) can preferably pick up the interfering influences beforehand at points of the apparatus relevant to the accuracy and, for the purpose of elimination, process them in particular in computing units, computers. In a further embodiment, the vibration sensors can be fixedly installed at characteristic points of the apparatus.

In a further possible embodiment, the apparatus can in particular be used with a combination of active and/or passive vibration damping, active and/or passive vibration absorption and/or active and/or passive vibration isolation, also constituted in a cascaded manner. In addition, the vibrations can, as interfering influences, be superimposed with forced vibrations, so that the detection of the alignment marks can take place in a so-called lock-in process. For the characterization of the apparatus and for checking the vibrational states, use can be made of modal analyses, and/or FEM. This and the design of such apparatuses are known to the person skilled in the art.

First and third detection units 3, 7 are clamped before or during or after a detection of first and third alignment markings 20, 22, wherein at least the absolute and/or relative degrees of freedom in the X- and Y-direction are reduced to zero. Relative is understood to mean the movement of first detection unit 3 with respect to third detection unit 7.

Figure 2B:
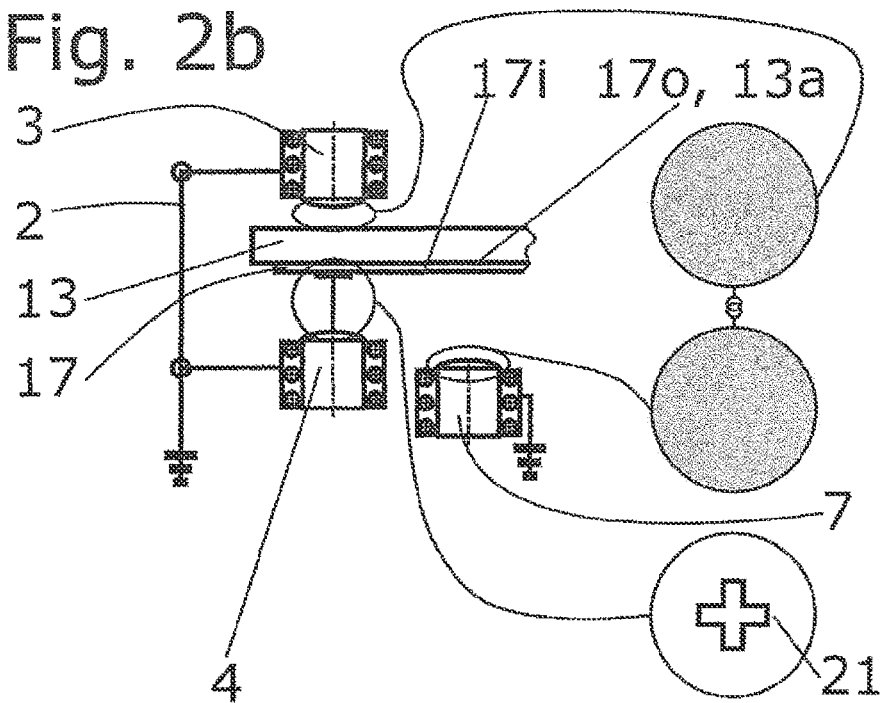
FIG. 2b shows a diagrammatic, enlarged cross-sectional representation of the embodiment according to FIG. 1a in a second process step.

FIG. 2*b* is a diagrammatic representation of a process step according to the invention for the measured value detection of second/upper substrate 17. Optical system 2 is in particular already in a clamped state and an image and/or an X-Y position of at least one alignment mark of first/lower substrate 16 is stored (not represented). In the clamped state, at least the absolute and/or relative degrees of freedom of the second detection unit are reduced to zero in the X- and Y-direction with respect to the first detection unit.

In the clamped state, the X-Y positions and/or alignment orientations of the first, second and third alignment markings can be related to the same X-Y coordinate system. Alternatively or in addition, the first, second and third detection units are calibrated on the same X-Y coordinate system.

Second/upper substrate 17 fixed on second/upper substrate holder 13 is moved into a detection position by means of second movement device 14 for the movement of second substrate holder 13 and the X-Y position and/or alignment orientation of second alignment marking 21 of second substrate 17 is detected by means of second/lower detection unit 4.

The aim is an alignment of second substrate 17 that is as perfect as possible with respect to the X-Y position and/or orientation of first/lower substrate 16. Since lower substrate 16 would be an obstacle in the optical path for the observation of second alignment marking 21 of second/upper substrate 17 by second detection unit 4, first/lower substrate 16 is moved out of the optical path, in particular by a movement in the X- and/or Y-direction, preferably without any movement in a Z-direction.

The correction of the X-Y position and the relative orientation of the two substrates is carried out by a comparison of the X-Y positions and/or alignment orientations of the first and second alignment markings correlated to the third alignment marking.

Once the alignment state of the second/upper substrate is reached with in particular a minimal, preferably eliminated, alignment error, the other substrate holder is clamped in this process step, i.e. its degrees of freedom are removed at least in the X- and Y-direction.

Figure 2C:
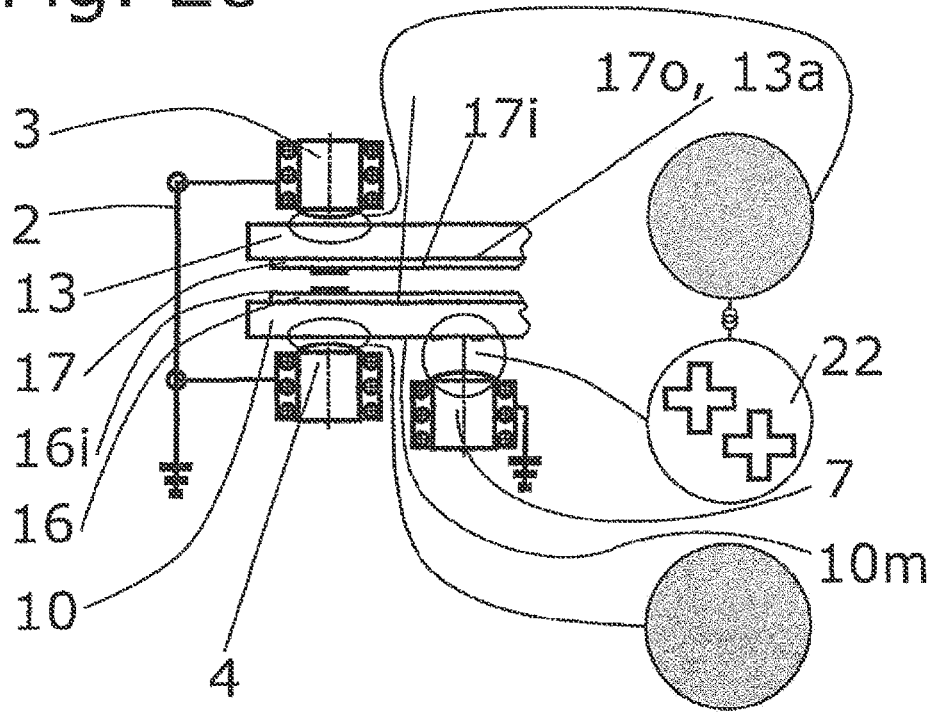
FIG. 2c shows a diagrammatic, enlarged cross-sectional representation of the embodiment according to FIG. 1a in a third process step.

FIG. 2c shows a diagrammatic representation of a process step according to the invention for the alignment of substrate 16 with respect to the, in particular clamped, second substrate 17.

The optical path of optical system 2 is blocked during the alignment between first detection unit 3 and second detection unit 4 by first substrate holder 10 and second substrate holder 13, so that detection units 3, 4 cannot be used during the alignment.

Additional measurement system 6 with third detection unit 7, which in a particularly preferred embodiment is a camera system with a microscope, generates, preferably in real-time, in particular continuously, image data which can be used as raw data for an X-Y position and/or orientation control.

The (theoretical or average) spacing (in particular without taking account of any pretensioning or sagging) of contact faces 16*i*, 17*i* to be bonded amounts in particular to less than 1 mm, preferably less than 500 microns, particularly preferably less than 100 microns, in the optimum case less than 50 microns, in the ideal case less than 10 microns. In particular, the spacing can be adjusted by movement devices 11 and/or 14.

In particular, a setpoint value ascertained/established according to FIG. 2*a* is used for the alignment of substrates 16 and 17. The setpoint value contains in particular image data of third alignment marking 22 of first substrate holder 10 and/or the ascertained X-Y position data and/or alignment orientation data for movement device 11 of first substrate holder 10 and/or control parameters such as path curves for the optimum approach of the X-Y position and/or in particular machine-readable values for the drives.

In a further embodiment, residual errors that are not eliminated in the positioning of the upper and/or lower substrate can be taken into account as correction values for the positioning of the other (lower or respectively upper) substrate.

By means of first movement device 11, first substrate holder 10 is moved in a position- and in particular orientation-controlled manner until such time as the alignment error, which is calculated from the setpoint value of the additional measurement system and the current position and/or orientation of the substrate holder, is minimised, in the ideal case is eliminated or an abort criterion is reached. In other words, lower substrate holder 10 is moved back in a controlled, regulated manner to the already known, measured X-Y alignment position.

In a further embodiment, residual errors that are not eliminated in the position of the upper and/or lower substrate can likewise be taken into account as correction values for the positioning of the other (lower or respectively upper) substrate.

Further correction factors can in particular be obtained from the vibrational state of the apparatus or parts of the apparatus as described previously which, used for the positioning of the substrates, reduce the residual uncertainty of the positioning and increase the alignment accuracy. For the verification of the final position, all the known interference factors and influences can again be taken into account and correspondingly corrected.

Finally, in this process step according to the invention, movements of substrate holders 10, 13 in an X-Y direction are prevented by clamping all the drives.

Once substrates 16, 17 have been aligned according to a method according to the invention, at least one of the substrates can be deformed in the direction of the other substrate by means of a substrate deformation device 15, in order to join the substrates together with a pre-bond.

LIST OF REFERENCE NUMBERS 1 alignment apparatus
2 optical system
3 first/upper detection unit
4 second/lower detection unit
5 positioning device
6 additional measurement system
7 third/additional detection device
8 positioning device of the additional measurement system
9 frame
10 first substrate holder
10*a* first fixing face
11 first movement device
12 common theoretical focal plane of the optical system
13 second/upper substrate holder
13*a* second fixing face
14 second movement device
15 substrate deformation device
16 lower substrate
16*i* first contact face
16*o* first support face
17 upper substrate
17*i* second contact face
17*o* second support face
20 first alignment marking
21 second alignment marking
22 third alignment marking

What is claimed is:

1. A method for aligning and contacting a first contact face of a first substrate with a second contact face of a second substrate, the method comprising:
   providing a first substrate having a first contact face and a first support face, and a second substrate having a second contact face and a second support face;
   fixing the first support face of the first substrate on a first substrate holder and the second support face of the second substrate on a second substrate holder, said second substrate holder being arranged opposite the first substrate holder;
   detecting a first X-Y position and/or a first alignment orientation of a first alignment marking arranged on the first substrate;
   detecting a second X-Y position and/or a second alignment orientation of a second alignment marking arranged on the second substrate;
   detecting a third X-Y position and/or a third alignment orientation of a third alignment marking arranged on the first substrate holder and/or the first substrate;
   aligning the first substrate with respect to the second substrate, comprising:
      correlating, in real-time during the aligning, the third X-Y position and/or the third alignment orientation of said third alignment marking with at least one of (i) the first X-Y position and/or the first alignment orientation of said first alignment marking and/or (ii) the second X-Y position and/or the second alignment orientation of said second alignment marking; and
      controlling the aligning of the first substrate with respect to the second substrate according to the real-time correlating; and
   contacting the first substrate with the second substrate, said first substrate being aligned with respect to the second substrate.

2. The method according to claim 1; wherein
(i) the first alignment marking and the third alignment marking are respectively arranged on opposite sides of the first substrate, or
(ii) the first alignment marking is arranged on a side of the first substrate facing away from the first substrate holder and the third alignment marking is arranged on a side of the first substrate holder facing away from the first substrate.

3. The method according to claim 1, wherein the first X-Y position is related to a focal plane of a first detection unit.

4. The method according to claim 1, wherein the first alignment marking is arranged on the first substrate at a peripheral region thereof.

5. The method according to claim 1, wherein the second X-Y position is related to a focal plane of a second detection unit.

6. The method according to claim 1, wherein the second alignment marking is arranged on the second substrate at a peripheral region thereof.

7. The method according to claim 1, wherein the detecting of the first X-Y position and/or the first alignment orientation of said first alignment marking and the detecting of the third X-Y position and/or the third alignment orientation of said third alignment marking takes place simultaneously.

8. The method according to claim 7, wherein a first detection unit is used for the detecting of the first X-Y position and/or the first alignment orientation of said first alignment marking and a third detection unit is used for the detecting of the third X-Y position and/or the third alignment orientation of said third alignment marking,
wherein said first and third detection units are synchronized.

9. The method according to claim 1, wherein the second substrate holder is fixed at least in the X-Y direction during the aligning of the first substrate with respect to the second substrate.

10. The method according to claim 1, wherein a first detection unit is used for the detecting of the first X-Y position and/or the first alignment orientation of said first alignment marking and a second detection unit is used for the detecting of the second X-Y position and/or the second alignment orientation of said second alignment marking,
wherein said first and second detection units are provided on a common X-Y positioning device and/or optical axes of the first detection unit and of the second detection unit are aligned with or assigned to one another, having a common optical axis.

11. The method according to claim 10, wherein a third detection unit is used for the detecting of the third X-Y position and/or the third alignment orientation of said third alignment marking.

12. The method according to claim 11, wherein the third detection unit is arranged fixedly in the X- and Y-direction at least with respect to the first detection unit with respect to an optical system comprising the first detection unit and the second detection unit, during the detecting of the third X-Y position and/or the third alignment orientation of said third alignment marking, at least until the aligning of the first substrate with respect to the second substrate.

13. The method according to claim 1, wherein control of the aligning of the first substrate with respect to the second substrate takes place exclusively by means of the detecting of the third X-Y position and/or the third alignment orientation of said third alignment marking.

14. The method according to claim 1, wherein the first substrate and the second substrate are arranged between the first substrate holder and the second substrate holder with a constant spacing A between the first contact face and the second contact face in a Z-direction during the detecting of the first and second X-Y positions and until the aligning of the first substrate with respect to the second substrate.

15. The method according to claim 14, wherein the spacing A is less than 500 microns.

16. A device for aligning and contacting a first contact face of a first substrate with a second contact face of a second substrate, said device comprising:
a first substrate holder for fixing a first support face of the first substrate;
a second substrate holder for fixing a second support face of the second substrate, said second substrate holder arrangeable opposite the first substrate holder;
a first detection unit for detecting a first X-Y position and/or a first alignment orientation of a first alignment marking arranged on the first substrate;
a second detection unit for detecting a second X-Y position and/or a second alignment orientation of a second alignment marking arranged on the second substrate;
a third detection unit for detecting a third X-Y position and/or a third alignment orientation of a third alignment marking arranged on the first substrate holder and/or the first substrate;
alignment means configured to align the first substrate with respect to the second substrate, the alignment means comprising:
correlation means configured to correlate, in real-time during aligning of the first substrate with respect to the second substrate, the third X-Y position and/or the third alignment orientation of said third alignment marking with at least one of (i) the first X-Y position and/or the first alignment orientation of said first alignment marking and/or (ii) the second X-Y position and/or the second alignment orientation of said second alignment marking; and
control means configured to control the aligning of the first substrate with respect to the second substrate according to the real-time correlating by the correlation means; and
contacting means for contacting the first substrate with the second substrate, said first substrate being aligned with respect to the second substrate.

17. The device according to claim 16, wherein
(i) the first alignment marking and the third alignment marking are respectively arranged on opposite sides of the first substrate, or
(ii) the first alignment marking is arranged on a side of the first substrate facing away from the first substrate holder and the third alignment marking is arranged on a side of the first substrate holder facing away from the first substrate.

18. The device according to claim 16, wherein the first detection unit and the third detection unit are synchronised.

19. The device according to claim 16, wherein the second substrate holder is fixed at least in the X-Y direction during the aligning of the first substrate with respect to the second substrate.

20. The device according to claim 16, wherein the first detection unit and the second detection unit are provided on a common X-Y positioning device and/or optical axes of the first detection unit and of the second detection unit are aligned with and assigned to one another, having a common optical axis.

21. The device according to claim 16, wherein the third detection unit is arranged fixedly in the X- and Y-direction, at least with respect to the first detection unit, with respect to an optical system comprising the first detection unit and the second detection unit, during the detecting of the third X-Y position and/or the third alignment orientation of said third alignment marking, at least until the aligning of the first substrate with respect to the second substrate.

* * * * *